(12) United States Patent
Ferru et al.

(10) Patent No.: US 10,177,258 B2
(45) Date of Patent: Jan. 8, 2019

(54) SEMICONDUCTOR DEVICE COMPRISING A DIODE AND ELECTROSTATIC DISCHARGE PROTECTION DEVICE

(71) Applicant: MURATA INTEGRATED PASSIVE SOLUTIONS, Caen (FR)

(72) Inventors: Gilles Ferru, Cairon (FR); Nicolas Nohlier, Deyme (FR); Bertrand Courivaud, Toulouse (FR)

(73) Assignee: MURATA INTEGRATED PASSIVE SOLUTIONS, Caen (FR)

( * ) Notice: Subject to any disclaimer, the term of this patent is extended or adjusted under 35 U.S.C. 154(b) by 0 days.

(21) Appl. No.: 15/510,162

(22) PCT Filed: Sep. 7, 2015

(86) PCT No.: PCT/EP2015/070411
§ 371 (c)(1),
(2) Date: Mar. 9, 2017

(87) PCT Pub. No.: WO2016/037990
PCT Pub. Date: Mar. 17, 2016

(65) Prior Publication Data
US 2017/0243984 A1    Aug. 24, 2017

(30) Foreign Application Priority Data
Sep. 10, 2014  (EP) ..................... 14306394

(51) Int. Cl.
| *H01L 29/866* | (2006.01) |
| *H01L 29/66* | (2006.01) |
| *H01L 29/06* | (2006.01) |
| *H01L 27/02* | (2006.01) |
| *H01L 27/15* | (2006.01) |

(52) U.S. Cl.
CPC ........ *H01L 29/866* (2013.01); *H01L 27/0248* (2013.01); *H01L 29/0688* (2013.01); *H01L 29/66106* (2013.01); *H01L 27/15* (2013.01)

(58) Field of Classification Search
CPC .............. H01L 29/866; H01L 29/0688; H01L 27/0248; H01L 29/66106; H01L 27/15
See application file for complete search history.

(56) References Cited

U.S. PATENT DOCUMENTS

| 6,534,759 B1* | 3/2003 | Koscielniak ...... H01L 27/14645 |
| | | 250/214.1 |
| 2007/0145411 A1 | 6/2007 | Chen et al. |
| 2011/0266592 A1 | 11/2011 | Hawe et al. |

FOREIGN PATENT DOCUMENTS

WO    2008099317    8/2008

OTHER PUBLICATIONS

B. Courivaud et al., "Novel 3D back-to-back diodes ESD protection," Electrical Overstress Electrostatic Discharge Symposium Proceedings (2014), 8 pages.

* cited by examiner

*Primary Examiner* — Kyoung Lee
(74) *Attorney, Agent, or Firm* — Arent Fox LLP (57) ABSTRACT

A semiconductor device comprising at least two holes (18, 20) realized in a substrate (6), having each a width and a depth, and forming a diode (4), wherein the substrate (6) has a determined type of doping, wherein the inner wall of each hole (18, 20) is doped so that its doping is of the other type than the doping of the substrate (6), and wherein the width and/or the depth of a hole (18, 20) is different from the width and/or the depth of a neighboring hole.

13 Claims, 9 Drawing Sheets

SEMICONDUCTOR DEVICE COMPRISING A DIODE AND ELECTROSTATIC DISCHARGE PROTECTION DEVICE

CROSS REFERENCE TO RELATED APPLICATIONS

The present application is a National Stage entry of International Application No. PCT/EP2015/070411, filed Sep. 7, 2015, which claims priority to European Patent Application No. 14306394.9, filed Sep. 10, 2014, the entire contents of each of which are incorporated herein by reference.

TECHNICAL FIELD

The invention relates to a semiconductor device comprising a diode and more specifically to an electrostatic discharge (ESD) protection device.

BACKGROUND

Light-Emitting Diodes (LEDs) integration is of major concern in the recent years for applications like signalling or for domestic lighting. Indeed, LEDs and more specifically high-brightness LEDs are expected to replace conventional lamps in lighting applications within few years.

Generally, these high-brightness LEDs have been developed with InGaN (gallium-indium) based materials grown on sapphire substrates that is an insulating material. The use of such substrate produces a high sensibility of the high-brightness LEDs to the electrostatic discharges.

Electrostatic discharges and electrostatic damages can occur at any point from manufacture to field service. It results from handling the devices in uncontrolled surroundings with inadequate ESD control practices. For instance, a forward biased ESD pulse will pass through the LED without damage, but a reverse biased ESD pulse will generate catastrophic failure.

InGaN LEDs dies are generally considered "Class 1" devices according to Military Standard Electrostatic Discharge Control (mil-std-1686c). To be considered "Class 1" the component needs survive to a voltage bias equal to 20 V, and to a voltage equal to 130 V from Human Body Model Testing. In order to avoid any reliability issue due to ESD discharges, LEDs manufacturers have many electronic devices available. The most popular ones are ceramic capacitors, Zener diodes, transient voltage suppression (TVS) diodes and Schottky diodes.

Among these devices, Zener diodes are widely used by design engineers worldwide for their low cost of fabrication. Further, they are more efficient than ceramic capacitors because they provide a stronger defense against overshoot voltage. Furthermore, they present also a higher clamping ratio (ratio between impulse clamping voltage and DC breakdown voltage), and they present a slower heat dissipation of ESD, which increases the clamping voltage level.

A correctly rated Zener diode reverse biased in parallel with the LED will allow voltage spikes to pass through the circuit in both directions without damaging the LED. Addition of a capacitor to smooth input signal is an appropriate corrective action to prevent electrostatic overstress (EOS) failures. To do that, it is common to use a Zener diode reverse biased in parallel with the LED on a ceramic carrier in order to have reliable lighting source.

Some LED manufacturers prefer to have back to back Zener diodes for ESD protection in order to have a symmetric device and to be able to measure the leakage current of the LED after assembly on the submount with the Zener diodes. A drawback of this solution is that it increases complexity and cost of the LED component. In a very competitive environment, it is an issue as the price of the LED has to decrease. So a very high pressure on ESD diode protection price is put.

In order to reduce the ESD protection price, the Zener diode has to be smaller and smaller while keeping the same ESD robustness. To overcome this issue, US 2007/0145411 proposes a method of manufacturing a trench polysilicon diode. The method includes forming a N− (P−) type epitaxial region on a N+ (P+) type substrate and forming a trench in the N− (P−) type epitaxial region. The method further includes forming an insulating layer in the trench and filling the trench with polysilicon forming a top surface of the trench. The method further includes forming P+ (N+) type doped polysilicon region and N+ (P+) type doped polysilicon region in the trench and forming a diode in the trench wherein a portion of the diode is lower than the top surface of the trench. This structure can be done by a better use of the piece of silicon available in 1 mm$^2$. The trench diodes have the advantage to use all the volume of silicon and to present a huge P/N junction area.

SUMMARY

The present invention aims to provide an alternative solution for increasing a current sustain in a diode. Another purpose of the invention is miniaturization of bidirectional Zener diodes for ESD protection. The structure proposed will advantageously be both usable for LEDs protection or for other devices protection.

According to a first aspect of the invention, it is proposed a semiconductor device comprising at least two holes realised in a substrate, having each a width and a depth, and forming a diode:

wherein the substrate has a determined type of doping, and wherein the inner wall of each hole is doped so that its doping is from the other type than the doping of the substrate, characterised in that the width and/or the depth of a hole is different from the width and/or the depth of a neighboring hole.

This new structure of a diode allows increasing the current driven into the diode. It has been observed by the inventors that the current driven by a diode does not linearly increase with the number of (same) holes—or pillars—of the diode. Experimentally, it was shown that the current is concentrated in the first lines of holes (or pillars). So, increasing the size of a prior art diode does not significantly increase the ESD robustness of the device. The new structure of a diode proposed here allows having a better repartition of the current in the structure and therefore an increasing of the current driven by the diode when its size increases.

In a first embodiment, each hole is a circular hole and the width of each hole corresponds to its diameter allowing controlling sizes and dimensions of the diode.

In another exemplary embodiment of the proposed diode, the diode comprises at least two lines of holes, each line of holes being parallel to the other lines; the holes of a same line of holes have the same width and the same depth, and the depth and/or the width of the holes is growing in one direction from a line of holes to a neighboring line of holes. In this way, the distribution of lines of current in the diode is controlled.

In a preferred embodiment of the proposed diode, each hole is a trench allowing decreasing a leakage current of the diode.

Advantageously, each trench is parallel to the other trenches and the depth and/or the width of the trenches is growing in one direction from a trench to a neighboring trench. Thus, current in the diode is controlled allowing decreasing over-heating.

The trenches present a length which is advantageously growing in one direction from a trench to a neighboring trench. In this way, the current sustained in the diode is increased.

Advantageously, holes of the proposed diode are coupled in parallel for distributing lines of current in the substrate of the diode and for allowing a unipolar ESD protection.

The invention concerns also an electrostatic discharge device comprising two diodes as described here above. Such a device allows an optimum ESD protection.

In an exemplary embodiment of this electrostatic discharge device, each diode comprises lines of holes and the lines of holes of a second diode are parallel to the lines of holes of a first diode. Thus, integration of diodes is optimised.

In a preferred embodiment each diode comprises trenches and the trenches of a second diode are parallel to the trenches of a first diode.

In order to realise a bi-directional ESD protection, the first diode and the second diode are coupled in a back to back position.

In an exemplary embodiment, an electrostatic discharge device comprises at least two semiconductor devices stacked together allowing optimising the integration of diodes.

In an exemplary embodiment, the electrostatic discharge device is coupled with an active and/or a passive electronic component for an efficient ESD protection.

BRIEF DESCRIPTION OF DRAWINGS

Embodiments of the present invention are illustrated by way of examples, and not by way of limitation, in the figures of the accompanying drawing, in which like reference numerals refer to similar elements and in which.

DETAILED DESCRIPTION OF EXEMPLARY EMBODIMENTS

Figure 1:
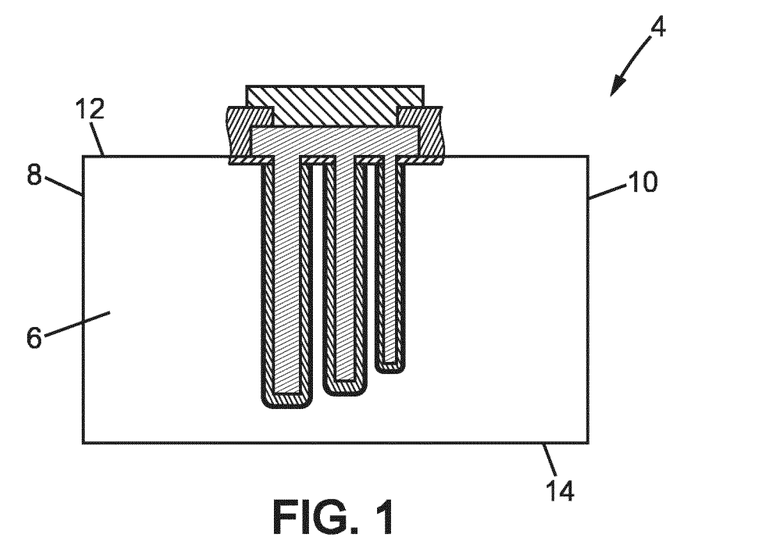
FIG. 1 is a schematic cross sectional view of a diode according to several embodiments.

FIG. 1 shows a schematic cross sectional view of a diode 4 integrated in a semiconductor device. The diode 4 is realised in a substrate 6 such as a silicon substrate. In the present description, we will suppose that the substrate 6 is a P-type doped substrate with a determined value of doping. Furthermore, characteristics of doping such as type of carriers and concentration value of carriers are adapted to reduce currents leakages of the diode 4. The doping level of the substrate 6 has to be chosen carefully as it will define the breakdown voltage of the diode. The value of the concentration of the carriers can be (only for illustrating and not limitative purposes) equal to $1 \times 10^{18}$ cm$^{-3}$. All further values given in this description are only illustrative and not limitative.

Doping processes being known from the skilled person of the art, such a process will not be presented in more details in this description.

As an alternative, a SOI substrate (Silicon On Insulator) can be used.

The substrate 6 comprises a first lateral side 8, a second lateral side 10 opposite to the first lateral side 8, a top side 12, a bottom side 14 opposite to the top side 12 and presents a determined thickness. The thickness of the substrate 6 is adapted to improve an integrated diode density value of diode 4. The thickness of the substrate 6 can be for example approximately equal to 100 μm (1 μm=$1 \times 10^{-6}$ m).

The diode 4 comprises, as shown on FIG. 1, at least three holes etched in the substrate 6. Each hole has a wall which is N-doped (we suppose here as indicated above that the substrate 6 is P-doped), i.e. the doping of the walls is from the other type than the doping of the substrate. Each hole is filled with polysilicon and polysilicon extends over the top side 12 so that all the holes are connected by the polysilicon. An electrode is realised at the top of the polysilicon.

As it appears on FIG. 1, the holes made in the substrate 6 are different. In the preferred embodiment illustrated on FIG. 1, the holes have different widths and depths. In the embodiment of FIG. 1, we can see that the width and the depth of each hole are decreasing from the first lateral side 8 to the second lateral side 10.

Since FIG. 1 is "only" a cross sectional view, it does not show the shape of the holes. As it will be apparent from the following description illustrating a process of manufacturing a diode according to FIG. 1, the holes illustrated here can have different shapes.

Figure 2:
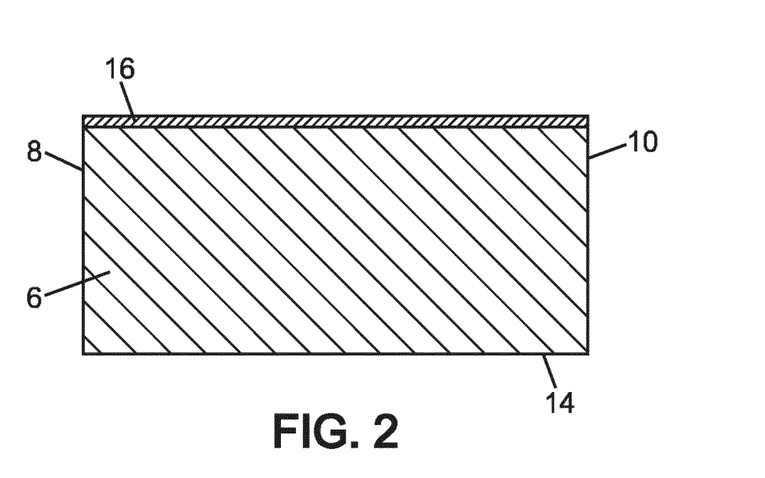
FIG. 2 is a schematic cross sectional view of a process step of manufacturing of a diode of FIG. 1.

As a first step of manufacturing the diode 4, a protection layer 16 is deposited on the top side 12 of the substrate 6. FIG. 2 illustrates this step of process. The protection layer 16 is adapted to resist to an etching step of the substrate 6. The etching step will be described in the following description. For example, the protection layer 16 comprises silicon oxide (SiO2) which is obtained by an oxidation step of the substrate 6. The oxidation step is realised by a wet oxidation process or by a dry oxidation process. These oxidation processes, being known from the skilled person of the art, will not be presented in more details in this description. For instance, the protection layer 16 has a thickness approximately equal to 1 μm.

In order to realise holes in the substrate 6, a photolithography step of filing a photo-resist layer (not shown on the figures) on the protection layer 16 is realised and determines sizes and shapes of the holes to be etched.

Figure 3:
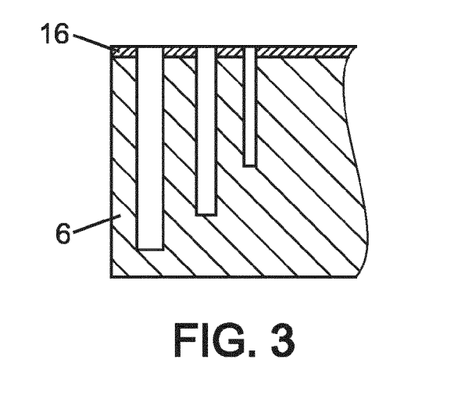
FIG. 3 is a schematic cross sectional view of a further process step of manufacturing a diode of FIG. 1.

The substrate 6 is etched through the holes realised in the protection layer 16. FIG. 3 illustrates this step of process. The holes are realised by at least one etching step of the top side 12 of the substrate 6. The etching step is for instance realised by a wet etching step or by a dry etching step, or a combination of dry etching followed by a step of wet etching. Thus, the roughness of the walls of holes is controlled.

Figure 4:
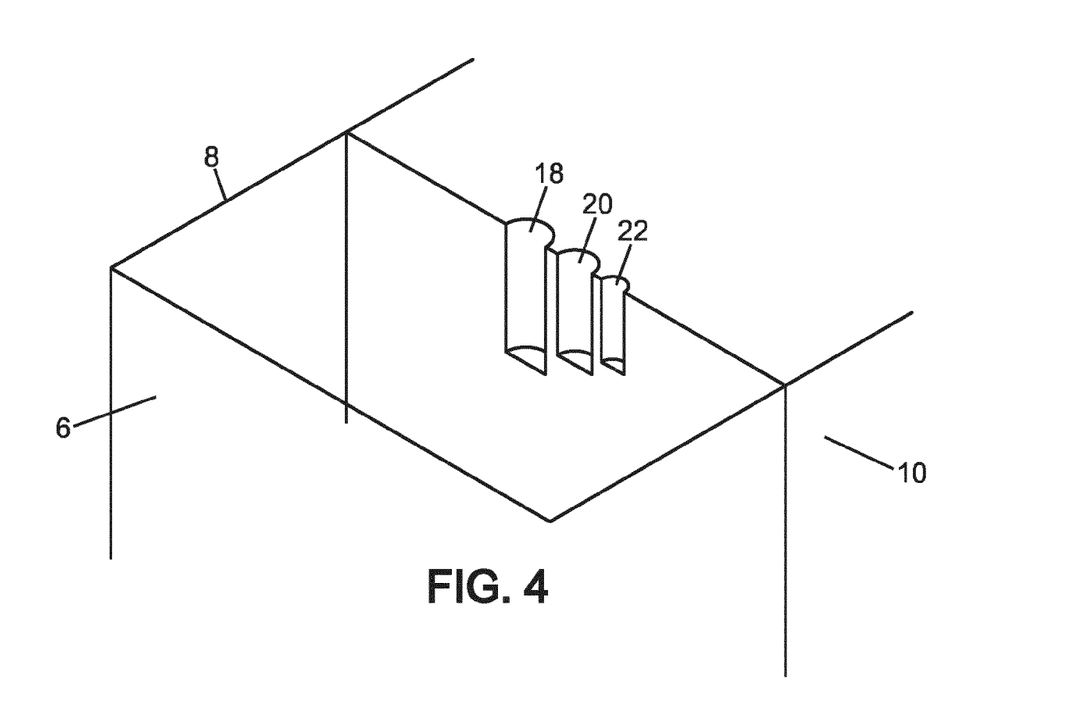
FIG. 4 is a partial isometric view corresponding to FIG. 3 for a first embodiment of a diode.

As mentioned above, the holes can have different shapes. FIG. 4 shows a first embodiment in which three holes are etched in the substrate 6: a first hole 18, a second hole 20 and a third hole 22 which are circular holes. The holes are spaced by a determined distance one to another. The first hole 18 is the hole nearest the first lateral side 8 of the substrate 6 and the third hole 22 is nearest the second lateral side 10 of the substrate 6. The second hole 20 is placed between the first hole 18 and the third hole 22. In an example, the distance between two holes is equal to 2 µm. The diameter and the depth of the holes decrease from the first lateral side 8 to the second lateral side 10 of the substrate 6. The diameter from the holes varies for example from 1 µm to 2 µm and the depth of the holes varies for example from 20 µm to 60 µm.

Figure 5:
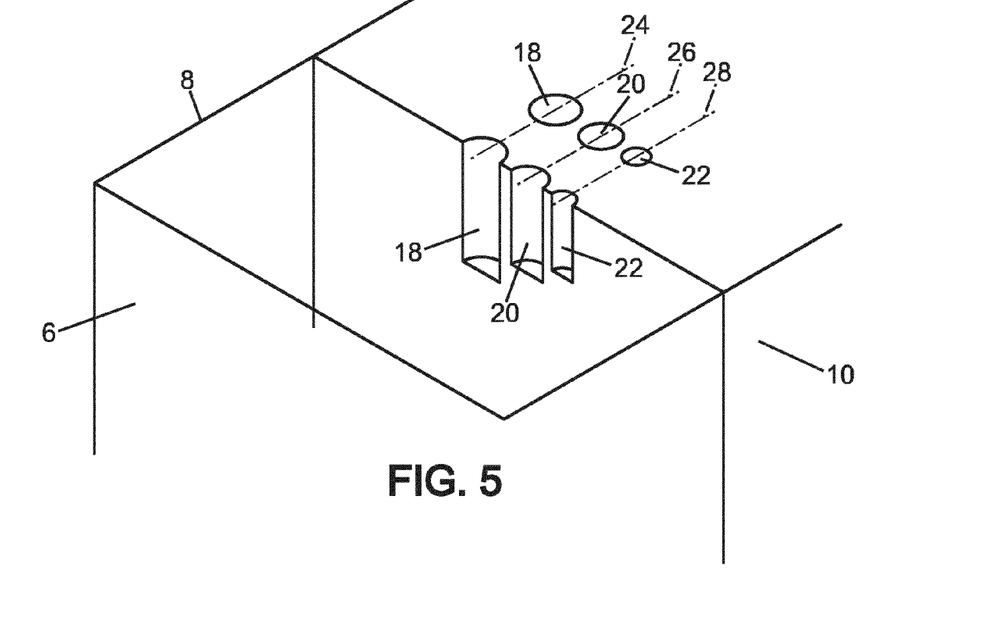
FIG. 5 is a partial isometric view corresponding to FIG. 3 for a second embodiment.

FIG. 5 illustrates another example in which the diode 4 comprises lines of holes. FIG. 5 illustrates the diode 4 with only three lines of holes and each line of holes comprises only two holes. Thus, the diode 4 will have a first line 24 of first holes 18, a second line 26 of second holes 20 and a third line 28 of third holes 22.

The lines of holes are parallel one to another. The depth and the width of the holes is growing from a line to a neighboring line of holes in the direction going from the second lateral side 10 to the first lateral side 8. The lines 24, 26, 28 of holes are parallel to the first lateral side 8 of the substrate 6 and the depth and width of the holes is growing in a direction perpendicular to these lines.

It is clear for a person skilled in the art that this embodiment can be generalised and that a determined number N of lines of holes can be realised. Also, the number of holes in the lines of holes will be quite often different of two. This number of holes in a line can also vary from a line to another. For instance, the number of holes will decrease from the first line 24 to the last line (in FIG. 5, the third line 28). The distribution of holes in the lines of holes will preferably be made with respect to a symmetry plane perpendicular to the lines of holes.

Advantageously, it is possible to combine the variation of any one of the cited parameters with another parameter. For instance, it is possible to combine the variation of number of lines of holes with the variation of the diameter of holes of the lines of holes.

Figure 6:
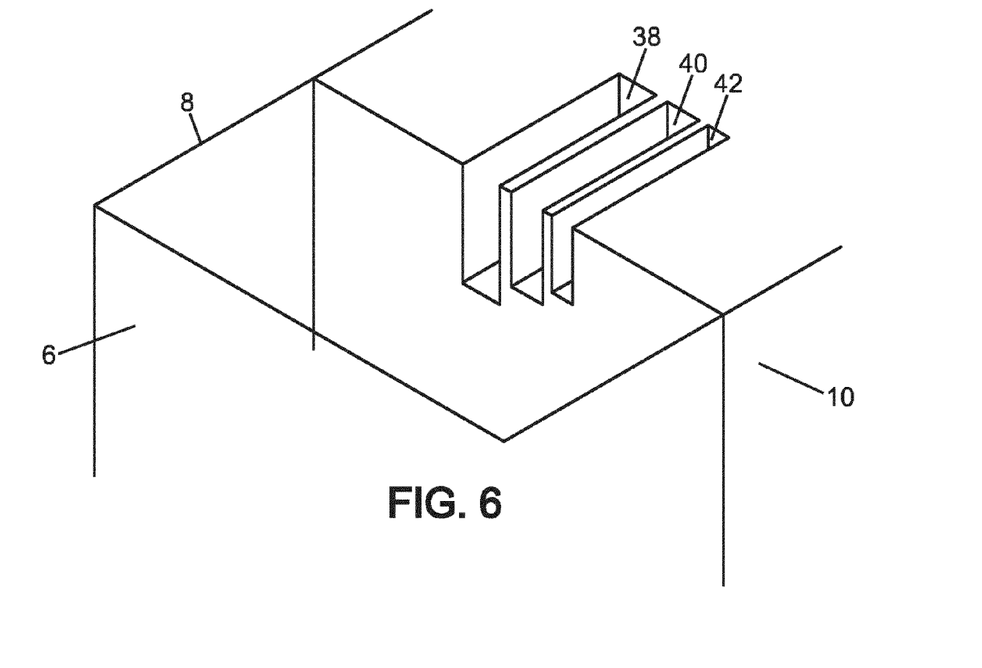
FIG. 6 is a partial isometric view corresponding to FIG. 3 for a third embodiment.

In a preferred example of realisation, each hole has the shape of a trench. FIG. 6 shows a first example of this embodiment wherein the diode 4 comprises three trenches 38, 40, 42. Each trench 38, 40, 42 presents a determined depth and width and is parallel to the first lateral side 8 of the substrate 6. In order to obtain an optimisation of the distribution of the current lines in the diode 4, the depth and the width of the trenches is growing in one direction from a trench to a neighboring trench. The trench 38, 40, 42 are parallel to the second lateral side 10 of the substrate 6. It is noted that the number of trenches may vary.

The distance between two neighboring trenches can be the same for all the trenches, for instance 10 µm. However, the distance between two neighboring trenches can also vary.

Figure 7:
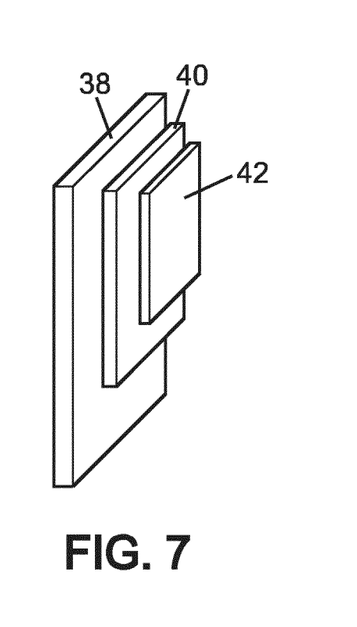
FIG. 7 is a schematic isometric view of trenches used for forming a diode.

In an example of embodiment, the length of the trenches 38, 40, 42 are also different. Thus, for instance, the length of the trenches is increasing in direction from the first trench 38 to the third trench 42 as illustrated by FIG. 7.

Figure 8:
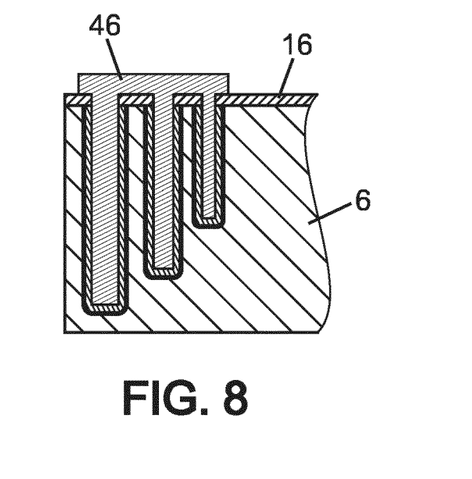
FIG. 8 is a sectional view of a further process step of manufacturing of a diode of FIG. 1.

After etching the holes, a step of doping is foreseen inside the holes (FIG. 8). This step of doping is realised for example by carrier's diffusion into the silicon substrate 6. Advantageously, thanks to the protection layer 16, carrier's diffusion is only realised onto the walls of the holes. Since we have considered that the substrate 6 is P-doped, the carriers used for doping here are N-carriers. The carrier's implantation step can be realised by a vapour gas deposition or by an ion implantation step.

If the distance between the holes is below the diffusion length of the dopant (for example phosphorous), the hole will be like a deep and uniform PN junction but if the distance between the holes is bigger, then several diodes in parallel are obtained. This second option is preferred and is chosen here.

Deposition and diffusion steps, being known from the skilled person of the art, will not be presented in more details in this description. Advantageously, thanks to the doping on the walls of the holes the serial resistivity of the diode 4 is lower.

Thereafter, a polysilicon layer 46 is deposited inside the holes (FIG. 8). The polysilicon layer 46 is deposited for instance by a Low-Pressure Chemical Vapour Deposition (LPCVD). The polysilicon layer 46 is advantageously a N-doped polysilicon because it will help to decrease the contact resistance of the diode but an amorphous silicon can also be used. Advantageously, the polysilicon layer 46 fills the holes and covers a determined area on the top side 12 of substrate 6 in order to connect all holes together. In a preferred embodiment of the invention, the polysilicon layer 46 exceeds the protection layer 16 of at least 1 µm. It is then patterned.

A passivation layer 48 (FIG. 9) is deposited on the top side 12 of the substrate 6 except to a determined area corresponding to a part of the exceed polysilicon layer 46. The passivation layer 48 is in this description.

Figure 9:
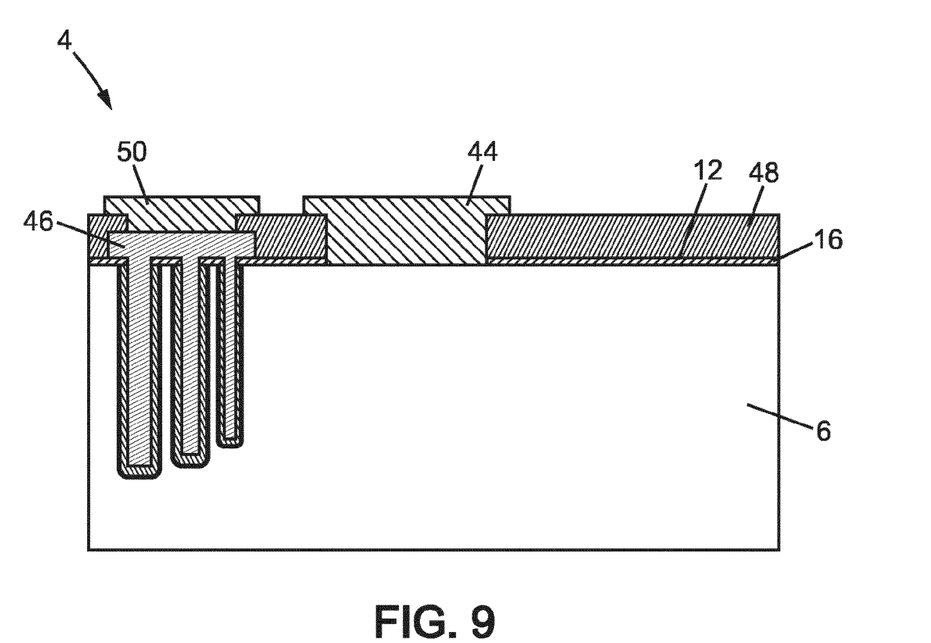
FIG. 9 is a sectional view of an alternative embodiment of a diode of FIG. 1.

A first electrode 44 and a for example a silicon oxide ($SiO_2$) or a silicon nitride layer with a thickness greater than the thickness of the excess of the polysilicon layer 46. Passivation process, being known from the skilled person of the art, will not be presented in more details second electrode 50 are realised by sputtering deposition of a conductive layer such as Aluminium (Al), or another type of metal, which is then patterned. The deposition process, being known from the skilled person of the art, will not be presented in more details in this description. The first electrode 44 is coupled electrically to the substrate 6 and the second electrode 50 is coupled the polysilicon layer 46. Advantageously, the first electrode 44 and the second electrode 50 of the diode 4 are positioned on the top side 12 of the substrate 6, allowing increasing integration value of the diode.

In order to increase the capability of driving current, the holes of the diode 4 are put in parallel.

The diode 4 can be coupled to a passive and/or an active component(s) or group of components.

Advantageously, the diode 4 is used for Electrostatic Discharge (ESD) protection. For instance, the diode 4 could be coupled to an input of a capacitor or a trench capacitor. It is noted that, the first electrode 44 and the second electrode 50 of the diode 4 are coupled to the component to be protected with taking into account polarity of the diode 4.

Thus, for instance, when an ESD positive polarity protection of an input of a circuit is realised with the diode 4, the second electrode 50 of the diode 4 is coupled to a supply terminal and the first electrode 44 is coupled to the input of the said circuit.

An ESD negative polarity protection can also be realised by the diode 4.

Figure 10:
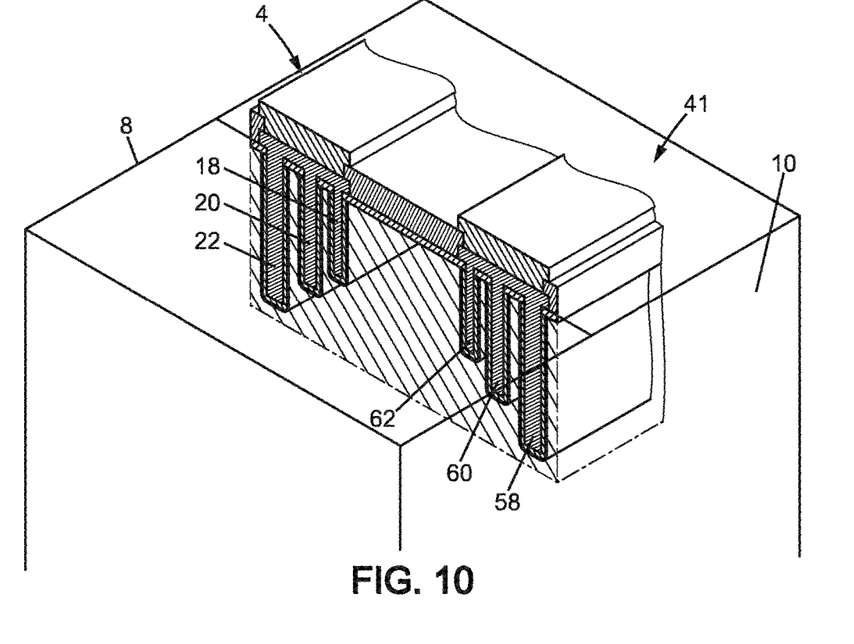
FIG. 10 is an isometric view of two diodes according to FIG. 9 in back to back position.

In order to realise a bi-polarity ESD protection, it is proposed an electrostatic discharge protection device comprising two diodes. FIG. 10 shows such an electrostatic discharge protection device comprising the diode 4 and a second diode 41. Advantageously, the second diode 41 has the same characteristics than the diode 4 and is symmetric to it. Furthermore, the second diode 41 can be obtained by the same process of manufacturing than the diode 4.

The second diode 41 and the diode 4 are manufactured on the same substrate 6. Thus, integration density of the electrostatic discharge protection device is optimised.

The second diode 41 on FIG. 10 has three holes: a first hole 62, a second hole 60 and a third hole 58. Since the second diode 41 is symmetric to the diode 4, the depth and the width of its holes is decreasing from the second lateral side 10 to the first lateral side 8. The second diode 41 is positioned so that its first hole 62 is positioned on the side of the first lateral side 8 of the substrate 6. The first hole 62 of the second diode 41 is separated by a determined distance of the first hole 18 of the diode 4. For instance, the distance between the first hole 62 of the second diode 41 and the first hole 18 of the diode 4 is equal to 75 µm.

In order to protect circuit(s), the diode 4 is advantageously coupled in series with the second diode 41 and more specifically the diode 4 and the second diode 41 are coupled in back to back position. This original structure allows obtaining an optimal ESD protection which supports positive and negative pulses in a normal operating mode of the protected circuit.

With such a structure, the electrostatic discharge protection device comprising the diode 4 and the second diode 41 allows protecting circuit(s) with a bi-directional ESD and allows obtaining a circuit with a better distribution of the current through the substrate 6.

In order to show the interest of the new structure proposed here, a comparison of the ESD robustness of two structures has been done. Two back to back diodes structures having the same footprint (24000 µm² for the all structure) were compared.

The first structure has 3D diodes with trenches having all the same width, the same depth and the same length. The diodes are positioned back to back and the distance between the diodes is 75 µm. Each diode is made with six trenches of equal width of 1 µm. The diode area is (18*224) µm²=4032 µm². The all structure area is 24000 µm².

The second structure has 3D diodes with trenches having the same length but growing width and depth from the front of the diode to the back of the diode. The smallest trench of a diode is in front of the smallest trench of the other diode. The diodes are positioned back to back and the distance between the diodes (between the smallest trenches) is 75 µm. Each diode is made with six trenches having a width between 1 µm and 2.2 µm. The diode area is (18*224) µm²=4032 µm² and the all structure area is 24000 µm².

Figure 11:
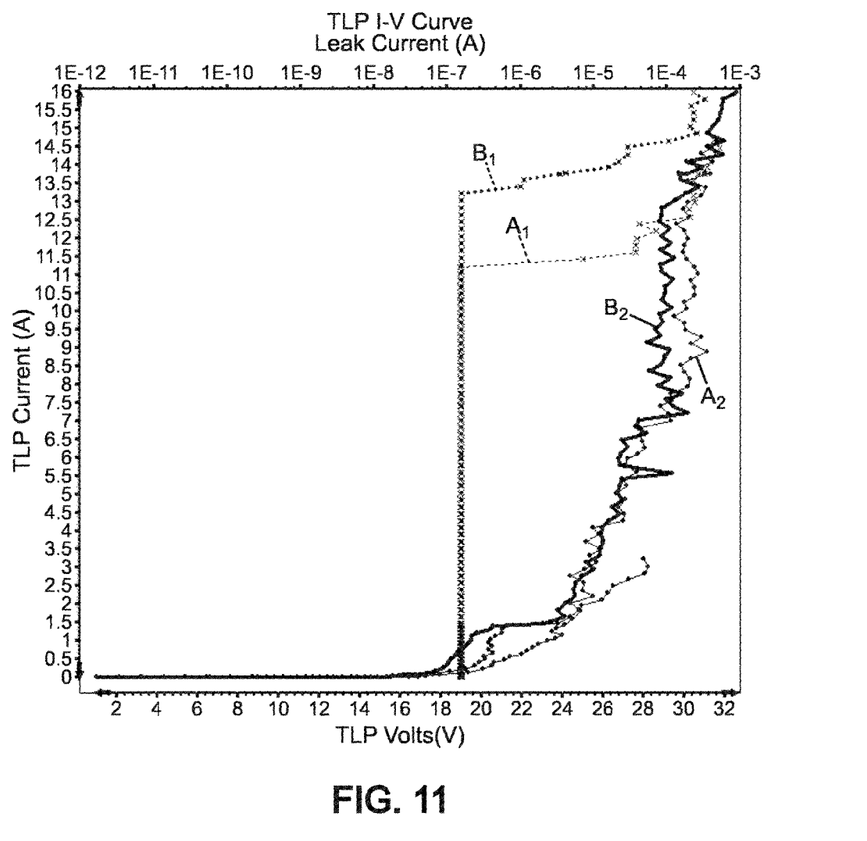
FIG. 11 represents experimental curves corresponding to a diode according to FIG. 10 and to a prior art diode.

FIG. 11 shows curves representing experimental results of measurements. On this figure, there are four curves with a first curve named $A_1$ (representing the leakage current) and a second curve named $A_2$ (representing the current versus voltage (I-V)) for the prior art back to back diodes with trenches having all same width and depth. The two other curves named $B_1$ (representing the leakage current) and named $B_2$ (representing the current versus voltage (I-V)) correspond to the back to back diodes (diodes 4, 41 with six trenches) with different widths and depths of trenches.

The ESD robustness of the diodes was made by using a Transmission Line Pulse (TLP) system which is an effective analysis tool. This system produces current pulses of a duration of 100 ns from 1 mA up to 20 A. It measures the direct current (DC) leakage after each pulse, allowing detecting damage to the sample. Higher will be the current forced through the diodes without any damage of them, higher will be the ESD robustness. Thanks to the different widths and depths of trenches, a TLP current circulating in the back to back diodes 4, 41 is greater than the TLP current of the prior art back to back diodes. Thus, the back to back diodes 4, 41 can sustain current pulses about 13 A maximum in this example while a prior art back to back diodes having the same structure area and having a same Zener voltage of 19V can only sustain current pulses about 11 A. Thus, TLP performances of the back to back diodes 4, 41 are higher of 20% than prior art back to back diodes structure.

Furthermore, thanks to the original structure diodes 4, 41 with a lower series resistance the current distribution through the substrate is improved allowing obtaining a good ESD protection level with a good ESD robustness.

Figure 12:
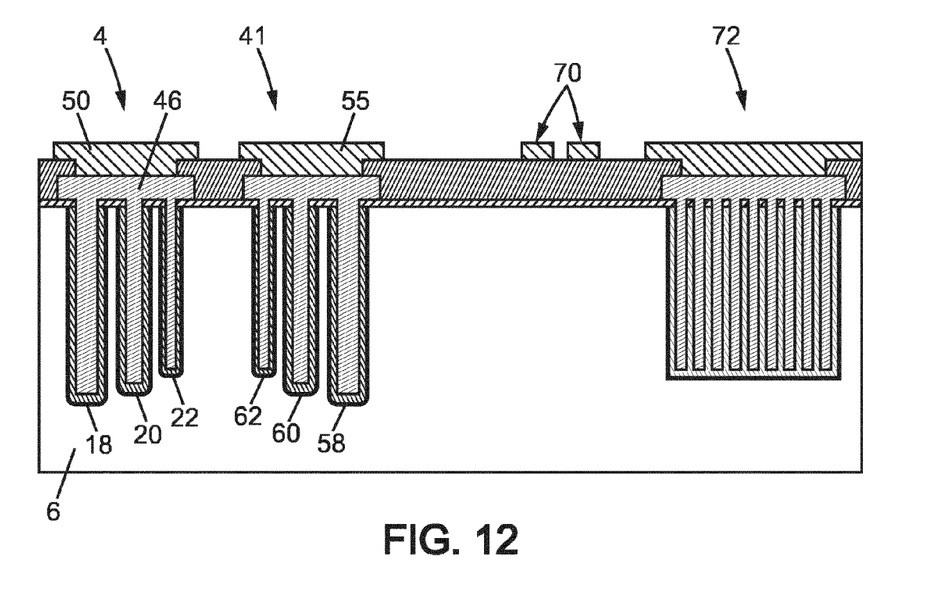
FIG. 12 is a cross view of the diodes of FIG. 11 coupled with a circuit.

FIG. 12 presents an example of integration of electrostatic discharge device comprising two diodes 4, 41 coupled to an active circuit comprising an inductor 70 and a high-value capacitor 72.

Figure 13:
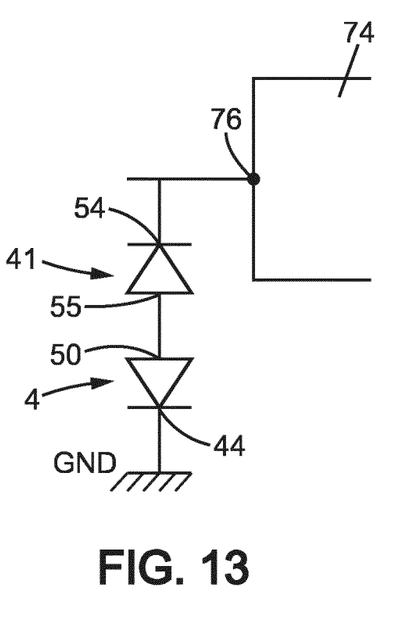
FIG. 13 is an equivalent electric circuit of the structure represented on FIG. 12.

FIG. 13 illustrates a schematically electrical circuit of such a device. In the case presented on FIG. 13, the high value capacitor 72 and the inductor 70 of the FIG. 12 are symbolized by a circuit 74 having an input 76.

The first electrode 44 of the diode 4 is coupled to an electrical ground, and the second electrode 50 of the diode 4 is coupled to a second electrode 55 of the diode 41. The first electrode 54 of the diode 41 is coupled to the input 76 The input 76 of the protected circuit 74 is adapted to receive for instance a signal (not show on the figure).

Thanks to the electrostatic discharge protection device, bi-directional disturbances can be evacuated. Thus, for a positive disturbance the input 76 is coupled to the ground GND and for a negative disturbance the input 76 is coupled to VCC. Another type of coupling can be considered.

Furthermore, in an advantageous embodiment of the invention the diode 4 could be stacked to another diode. Furthermore, an electrostatic discharge protection device comprising at least two diodes 4, 41 could be stacked to another electrostatic discharge protection device allowing to protect several inputs of circuits.

It is noted that the electrostatic discharge protection device can be coupled to an active circuit and/or a passive circuit. It is also possible to connect the electrostatic discharge protection device to another type of component or circuit such as inductor or a high-value capacitor.

The present invention provides a diode which is easy to manufacture. The invention also provides an electrostatic discharge protection device comprising two diodes coupled in series with a high integrated density value and with a high TLP current.

With the structures described here above, it is proposed to get a better spreading of the current by decreasing the electrical resistance of the holes (preferably of the trenches) at the back of the structure. It is achieved by widening the width and/or the depth of the holes (trenches) which are at the back of the diode structure.

A first physical effect is generated by the growing width of the holes from the front of the diode to the back of the diode. If the holes at the back of the diode have a larger width, they have a lower series resistance compared to the holes in the front of the diode. So there is a better uniformity of the current through the device. For a given applied current, the current density (relative to prior art diodes with the same size but similar holes) is lower in the front holes and there are few hot spots in the silicon. The device is therefore more robust to ESD.

A second physical effect is generated by the growing depth of the holes. The deeper holes at the back of the diode allow a better silicon use since a bigger part of the silicon is used. During an ESD event, there is thus a better distribution of the current through the substrate.

While the invention has been illustrated and described in details in the drawings and foregoing description, such illustration and description have to be considered as illustrative or exemplary and not restrictive, the invention is not limited to the disclosed embodiments. Variations to the disclosed embodiments can be understood and effected by those skilled in the art in practicing the claimed invention, from a study of the drawings, the disclosure, and the appended claims.

The invention claimed is:

1. A semiconductor device comprising,
    at least two holes formed in a substrate, the at least two holes each having a width and a depth, and forming a diode,
    wherein the substrate has a determined type of doping,
    wherein respective inner side walls and a bottom of each hole are doped to have a doping other than the doping of the substrate, and
    wherein at least one of a width and a depth of a hole is different from at least one of a width and a depth, respectively, of a neighboring hole.

2. A semiconductor device according to claim 1, wherein each hole is a circular hole and in that the width of each hole corresponds to the diameter of the respective hole.

3. A semiconductor device according to claim 1, wherein the diode comprises at least two lines of holes, each line of holes being parallel to the other lines,
    wherein the respective holes of a same line of holes have the same width and the same depth, and
    wherein at least one of the depth and the width the holes is growing in one direction from a line of holes to a neighboring line of holes.

4. A semiconductor device according to claim 1, wherein each hole is a trench.

5. A semiconductor device according to claim 4, wherein each trench is parallel to the other trenches, and
    wherein at least one of the depth and the width of the trenches is growing in one direction from a trench to a neighboring trench.

6. A semiconductor device according to claim 5, wherein each trench comprises a length that
    is growing in said one direction from a trench to a neighboring trench.

7. A semiconductor device according claim 1, wherein the at least two holes are coupled in parallel.

8. An electrostatic discharge device, comprising at least two diodes according to claim 1.

9. An electrostatic discharge device according to claim 8, wherein each diode comprises lines of holes and the lines of holes of a second diode are parallel to the lines of holes of a first diode.

10. An electrostatic discharge device according to claim 8, wherein each diode comprises trenches and the trenches of a second diode are parallel to the trenches of a first diode.

11. An electrostatic device according to claim 8, wherein the first diode and the second diode are coupled in back to back position.

12. An electrostatic discharge device according to claim 8, comprising at least two semiconductor devices stacked together.

13. An electrostatic discharge system according to claim 8, wherein the electrostatic discharge system is coupled to at least one of an active and a passive electronic component.

* * * * *